United States Patent
Kobayashi

[11] Patent Number: 5,883,425
[45] Date of Patent: *Mar. 16, 1999

[54] CIRCUIT DEVICE

[75] Inventor: Eiji Kobayashi, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 647,049

[22] Filed: May 9, 1996

[30] Foreign Application Priority Data

Oct. 27, 1995 [JP] Japan .................................. 7-280704

[51] Int. Cl.$^6$ ........................... H01L 23/02; H01L 23/12; H01L 23/10; H01L 23/34
[52] U.S. Cl. .......................... 257/678; 257/704; 257/710; 257/723; 257/797; 257/779
[58] Field of Search ..................................... 257/678, 704, 257/710, 723, 701, 792, 779, 780

[56] References Cited

U.S. PATENT DOCUMENTS 5,151,773  9/1992  Matsui et al. ............................ 257/730
5,276,289  1/1994  Satoh et al. ............................. 257/723
5,570,274  10/1996 Saito et al. .............................. 257/724

FOREIGN PATENT DOCUMENTS 58-122755  7/1983  Japan ..................... 257/704
487354  3/1992  Japan ..................... 257/710

Primary Examiner—Teresa M. Arroyo
Attorney, Agent, or Firm—Oblon, Spivak, McClelland, Maier, & Neustadt, P.C.

[57] ABSTRACT

A circuit device, for example, a hybrid integrated circuit device, for improving the positioning accuracy of a frame element is disclosed. At least two thick film electrodes (7a) of circular configuration having a diameter of 0.3 mm or greater are formed on a component mounting surface (7S) of a thick film substrate (7) along outer wall peripheries (5OE) of a bottom surface (5B) of a frame element (5) bonded on the component mounting surface (7S) with an adhesive (6), and raised portions (4a) consisting essentially of solder are formed on the thick film electrodes (7a), respectively. The presence of the raised portions (4a) determines the position of the frame element (5) and prevents positional error of the frame element (5). The thick film electrodes (7a) may be of rectangular configuration which allows stabler positioning of the frame element (5). The thick film electrodes (7a) and raised portions (4a) may be formed along inner wall peripheries of the bottom surface (5B) of the frame element (5).

11 Claims, 8 Drawing Sheets

CIRCUIT DEVICE

BACKGROUND OF THE INVENTION

1. Field of the Invention

The present invention relates to a circuit device, for example, a hybrid integrated circuit device, which has a plurality of components including active and passive devices, such as a semiconductor device and a capacitor, mounted on a mounting substrate such as a thick film substrate or printed board, and a frame element or cap fixed on the mounting substrate to protect the mounted components, and a method of fabricating the same.

2. Description of the Background Art

FIG. 18 is a cross-sectional view of an example of conventional hybrid integrated circuit devices. In FIG. 18, the reference numeral 1 designates a thick film substrate; 2 designates a flip chip IC connected to and fixed on thick film electrodes (not shown) formed on a component mounting surface of the thick film substrate 1 with solder bumps; and 3 designates a multilayer capacitor chip connected to and fixed on thick film electrodes (not shown) formed on the component mounting surface of the thick film substrate 1 with solder material 4. These components 2 and 3 are covered with silicone resin 20.

In the conventional hybrid integrated circuit device, the mounted components are covered with silicone resin to ensure water repellency. However, the mounted components must be also protected from the action of external forces and completely protected from moisture.

SUMMARY OF THE INVENTION

According to a first aspect of the present invention, a circuit device comprises: a mounting substrate; a plurality of components formed on a component mounting surface of the mounting substrate; a frame element bonded on the component mounting surface for covering all of the plurality of components; at least two conductive pattern portions locally formed on the component mounting surface for positioning the frame element; and raised portions consisting essentially of solder and formed on the conductive pattern portions, respectively.

This permits the at least two locally formed raised portions to position the frame element without positional error. Consequently, the frame element is reliably prevented from contacting the components within the frame element, and the original functions of the frame element are sufficiently accomplished.

According to a second aspect of the present invention, a method of fabricating a circuit device comprises the steps of: providing a mounting substrate, a plurality of components to be mounted thereon, and a frame element configured to cover all of the plurality of components; forming on a component mounting surface of the mounting substrate a plurality of component mounting electrodes and at least two frame element positioning electrodes positioned around the plurality of component mounting electrodes and having a predetermined pattern; applying solder paste onto the plurality of component mounting electrodes and the frame element positioning electrodes; mounting and temporarily fixing the components on the solder paste applied to the plurality of component mounting electrodes in respectively corresponding relation and performing heat treatment at a temperature above the melting point of the solder paste to solder the plurality of components to the plurality of component mounting electrodes and to form raised portions on the frame element positioning electrodes, respectively; and bonding and fixing the frame element on the component mounting surface while positioning the frame element in alignment with at least two of the raised portions.

In this fashion, according to the method of the present invention, the raised portions for positioning the frame element may be formed during the process step of mounting the plurality of components.

It is therefore a primary object of the present invention to provide a circuit device having an improved frame element positioning accuracy, with a minimum amount of positional error of the frame element relative to a plurality of components mounted on a mounting substrate.

It is another object of the present invention to further stabilizes the frame element positioning.

It is still another object of the present invention to reduce the size of the circuit device at the same time.

It is a further object of the present invention to effectively preventing an adhesive from flowing in the frame element when bonded and from adhering to the components by effectively utilizing space while positioning the frame element.

It is a still further object of the present invention to readily fabricate such a circuit device, or to facilitate the work.

These and other objects, features, aspects and advantages of the present invention will become more apparent from the following detailed description of the present invention when taken in conjunction with the accompanying drawings.

DESCRIPTION OF THE PREFERRED EMBODIMENTS

To solve the problems of the background art, it is necessary to cover the entire mounted components with a solid-state member. A new hybrid integrated circuit device being currently developed by the applicant of the present invention because of such necessity is shown in cross section in FIG. 17.

Figure 17:
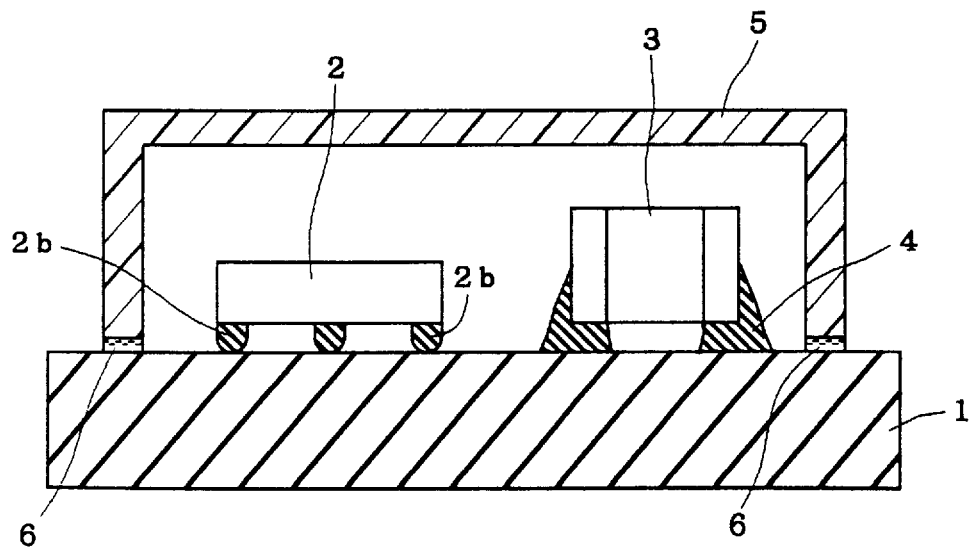
FIG. 17 is a cross-sectional view of a new hybrid integrated circuit device as a background of the present invention.
Figure 18:
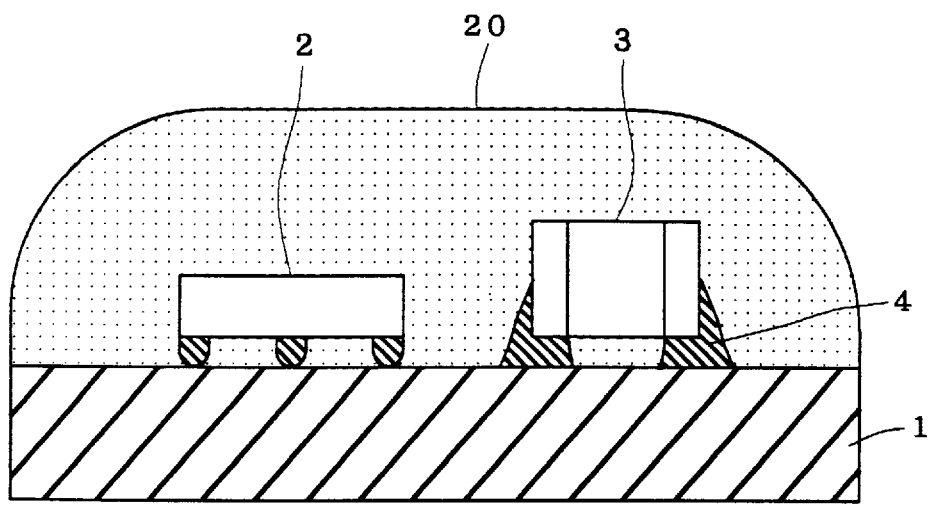
FIG. 18 is a cross-sectional view of a conventional hybrid integrated circuit device.

In FIG. 17, reference numerals 1 through 4 designate elements corresponding to those of FIG. 18. The reference numeral 5 designates a resin-made frame element or cap for protecting the mounted components such as the flip chip IC 2 and multilayer capacitor chip 3 against foreign substance to be applied thereto and the action of external forces; 6 designates an adhesive for fixing the frame element 5 on a component mounting surface of the thick film substrate 1; and reference character 2b designates solder bumps.

The hybrid integrated circuit device of FIG. 17, however, presents drawbacks to be described below. Recent demand for size-reduced and high-density devices further decreases the space between the inner wall side surfaces of the frame element 5 and the mounted components such as the flip chip IC 2 and multilayer capacitor chip 3, causing a non-negligible amount of positional error during bonding of the frame element 5. The positional error brings the frame element 5 into contact with the mounted components, resulting in qualitatively non-negligible adverse effects on the mounted components. The contact also causes disconnection of the components from electrodes because of thermal expansion or the like.

The present invention is made to solve the drawbacks presented with the hybrid integrated circuit device which is under development but is not known in the art. The detailed structure of the present invention will be described hereinafter.

(First Preferred Embodiment)

A first preferred embodiment according to the present invention is described below with reference to the drawings.

Figure 1:
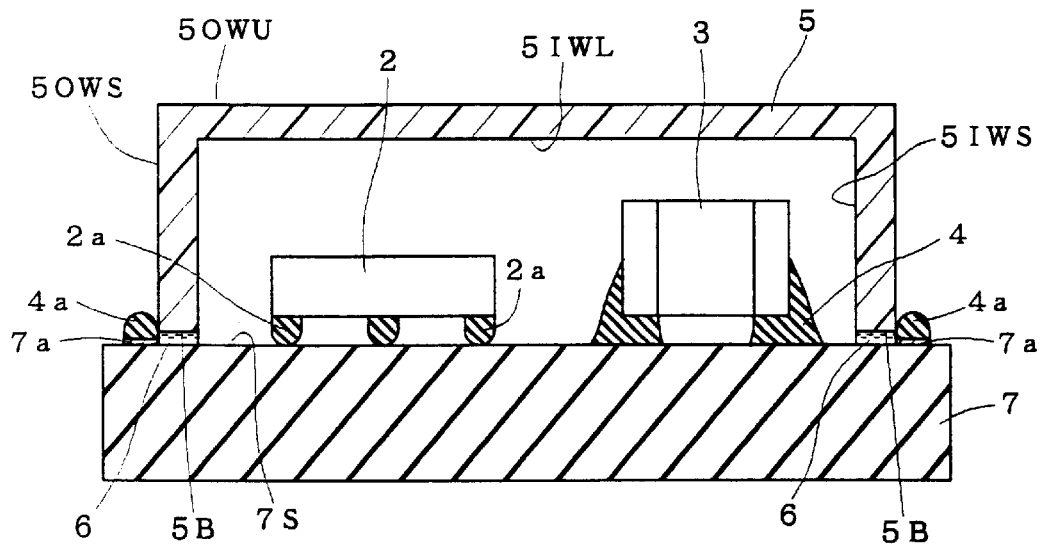
FIG. 1 is a cross-sectional view of a hybrid integrated circuit device according to a first preferred embodiment of the present invention.
Figure 2:
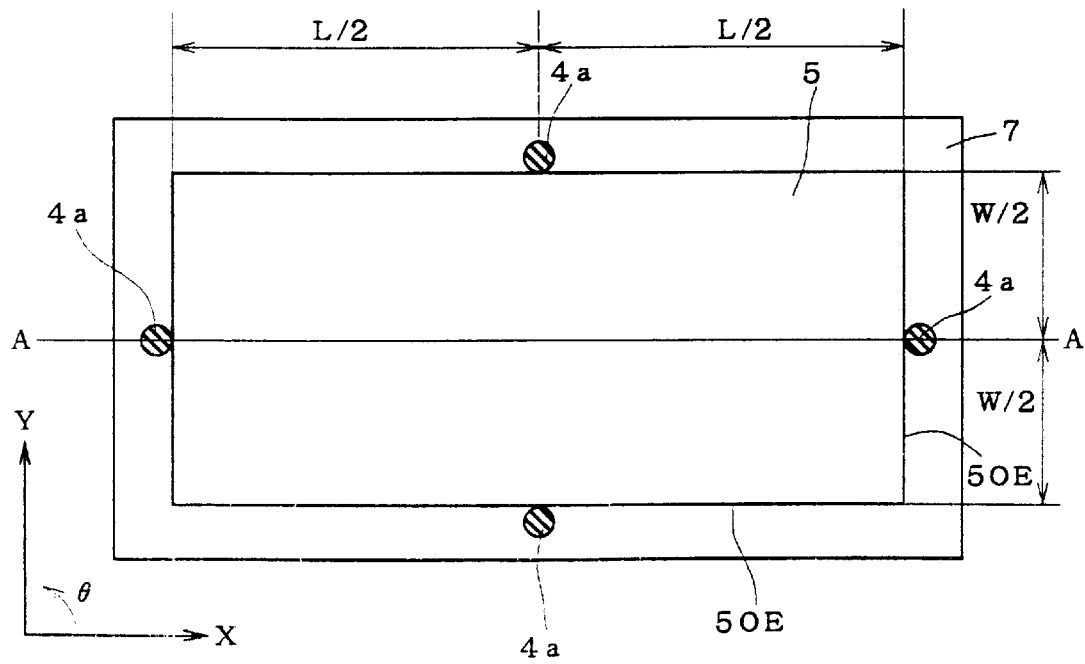
FIG. 2 is a plan view of the hybrid integrated circuit device according to the first preferred embodiment of the present invention.

FIG. 1 is a cross-sectional view of an exemplary hybrid integrated circuit device. FIG. 2 is a plan view of the hybrid integrated circuit device. FIG. 1 corresponds to a cross section taken along the line A—A of FIG. 2.

In FIGS. 1 and 2, the reference characters W and L designate the width and length of a frame element, respectively; 2 designates a flip chip IC; and 3 designates a multilayer capacitor chip. Such active and passive devices are generically referred to herein as a plurality of components (2, 3).

The reference numeral 5 designates a frame element made of resin herein for protecting the plurality of components (2, 3) against the action of external forces and foreign substance to be applied thereto. The material of the frame element 5 is not limited to an insulating material but may be a conductive material The frame element 5 is cap-shaped and has a bottom surface 5B to be coated with an adhesive 6, an outer wall upper surface 5OWU, four outer wall side surfaces 5OWS, an inner wall lower surface 5IWL, and four inner wall side surfaces 5IWS. It should be noted that the frame element 5 may be of any configuration.

The reference numeral 7 designates a thick film substrate (mounting substrate), such as an alumina ($Al_2O_3$) substrate, having a component mounting surface 7S. Formed on the component mounting surface 7S are thick film electrodes (not shown) for the plurality of components (2, 3) and thick film electrodes 7a for positioning the frame element 5 both of which are made of AgPd, for example. The frame element positioning thick film electrodes 7a are locally positioned at substantially the midpoint of corresponding outer wall peripheries 5OE of the bottom surface 5B of the frame element 5, respectively, and are of circular configuration with a diameter of 0.3 mm or greater. The thick film electrodes 7a are preferably of small size in terms of space. The thick film electrodes 7a are also referred to hereinafter as "conductive pattern portions".

Figure 3:
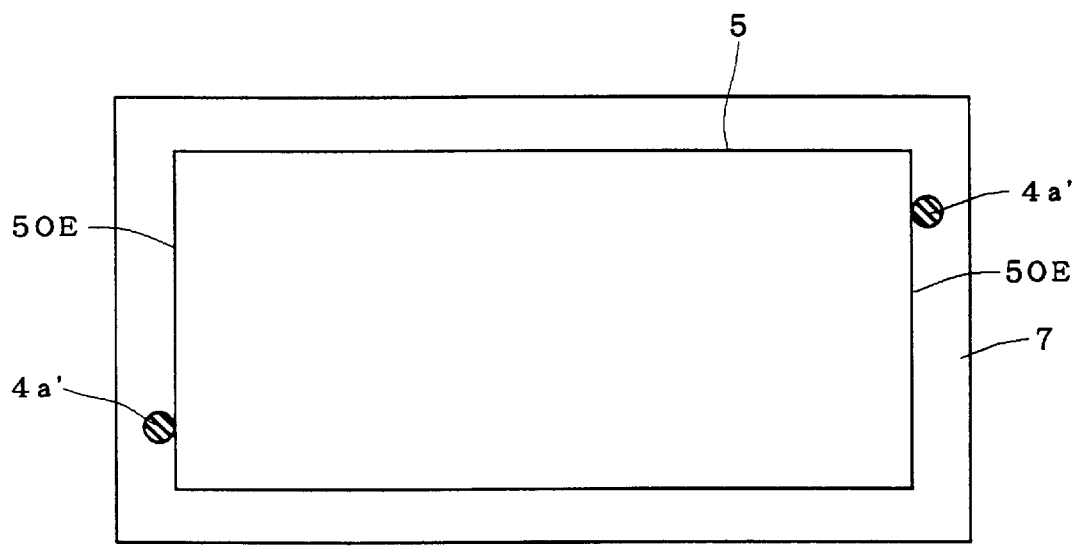
FIG. 3 is a plan view of a variation of the hybrid integrated circuit device of the first preferred embodiment.

The four conductive pattern portions 7a are formed at substantially the midpoint of the respective outer wall peripheries 5OE, but the present invention is not limited to such an arrangement. At least two conductive pattern portions 7a should be locally formed on the component mounting surface 7S along the corresponding outer wall peripheries 5OE of the bottom surface 5B of the frame element 5, respectively. An example of this arrangement is shown in plan view of FIG. 3.

Figure 4:
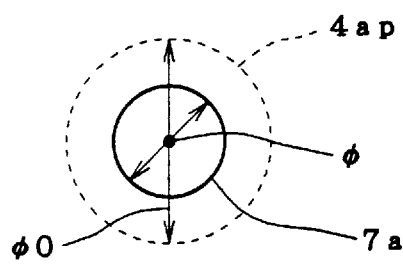
FIG. 4 is a plan view showing the dimensions of the area of solder paste and a conductive pattern portion.
Figure 5:
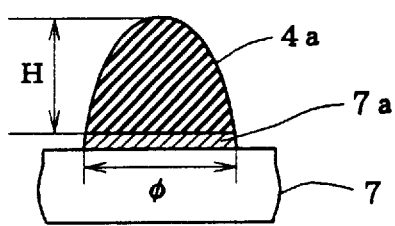
FIG. 5 is a cross-sectional view showing the dimensions of a solder raised portion and the conductive pattern portion.

A raised portion 4a consisting essentially of solder is formed on an upper surface of each thick film electrode 7a. The raised portions 4a are typically formed in a manner to be described below. As shown in plan view of FIG. 4, solder paste is applied by the photolithographic process to the inside of an area 4aP (having a diameter $\phi 0$) greater than an area (having a diameter $\phi$; $\phi 0 > \phi$) wherein the thick film electrode is formed, and is then heated to form the raised portion 4a including a solder layer. During the heat treatment, the solder paste is condensed because of its surface tension to form the raised portion 4a having a height H and a maximum cross-sectional diameter $\phi$ as shown in cross section of FIG. 5. Thus, the height H is controlled depending on the setting of the area 4aP of FIG. 4 and, accordingly, the setting of the diameter $\phi 0$.

The solder raised portions 4a of 0.3 mm in diameter at substantially the midpoint of the respective outer wall peripheries 5OE of the frame element 5 determine the position of the frame element 5 in the X, Y and $\theta$ directions.

The local positioning of the solder raised portions 4a allows the bottom portion of the outer wall side surfaces 5OWS of the frame element 5 (including the adhesive 6) to be in point contact with the raised portions 4a (the contact is exactly line contact but is defined as point contact herein). The presence of the raised portions 4a determines the position of the frame element 5, improving the positioning accuracy of the frame element 5.

In this manner, at least two raised portions 4a formed on the conductive pattern portions 7a determine the mounting position of the frame element 5 on the component mounting surface 7S, suppressing deviation of the frame element 5 in the X, Y and $\theta$ directions and preventing the frame element 5 from contacting the inside components (2, 3). This solves the problems resulting from the provision of the frame element 5.

Particularly, in this preferred embodiment, since the raised portions 4a are formed along (or in contact with) the corresponding outer wall peripheries 5OE of the bottom surface 5B of the frame element 5, an operator may bond and fix the frame element 5 in a desired position on the component mounting surface 7S, particularly by hand, while visually confirming the raised portions 4a. This is advantageous in ease of work and reliability. The term "along" used in this specification covers a wide meaning including "in contact with".

The provision of the four raised portions 4a corresponding to the respective outer wall peripheries 5OE of the frame element 5 at substantially the midpoint of the outer wall peripheries 5OE in this preferred embodiment permits more reliable and stabler positioning of the frame element 5 than the provision of two raised portions 4a in any position.

Additionally, the conductive pattern portions 7a and raised portions 4a are of circular or round configuration in maximum cross section in this preferred embodiment. The current technology can control the diameter φ of the conductive pattern portions 7a and raised portions 4a to a minimum of 0.3 mm. Thus, the arrangement of this preferred embodiment allows the provision of the conductive pattern portions 7a and raised portions 4a on the component mounting surface 7S by using a small clearance if sufficient space for the conductive pattern portions 7a is not provided on the component mounting surface 7S. In this regard, the technique of this preferred embodiment matches the design principle of reducing the size of the hybrid integrated circuit device.

(Second Preferred Embodiment)

Figure 6:
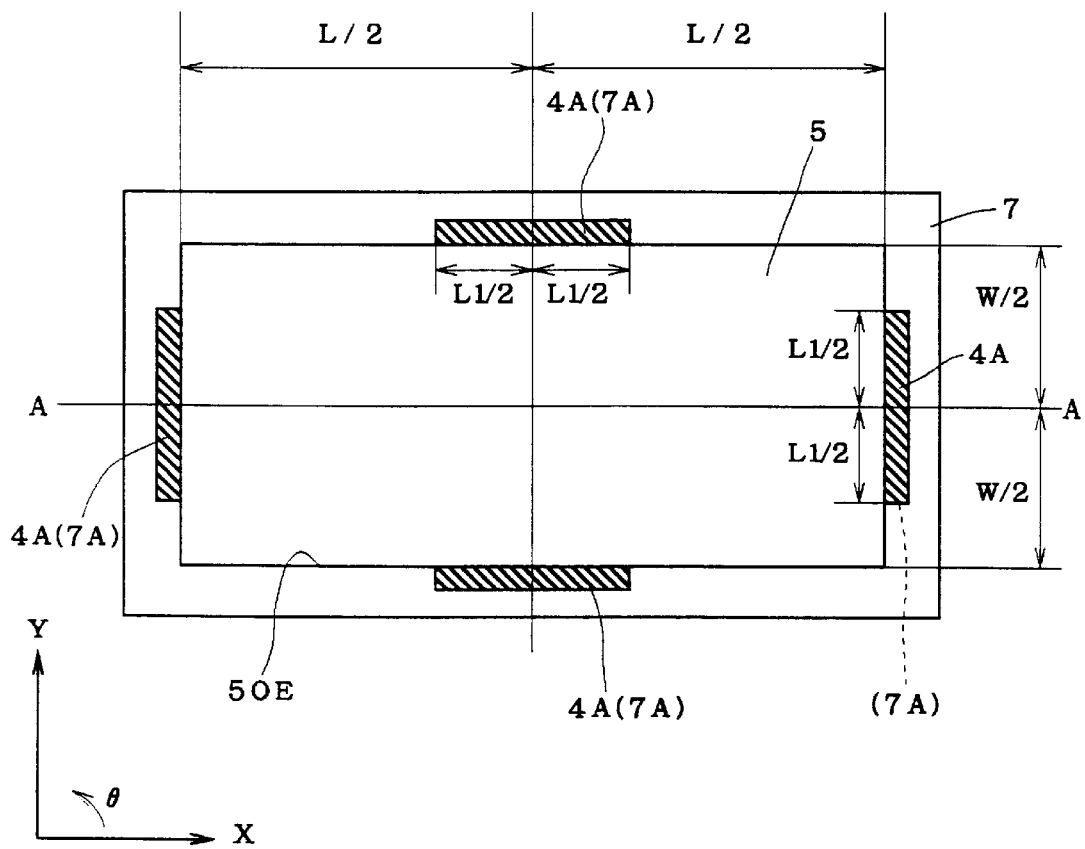
FIG. 6 is a plan view of the hybrid integrated circuit device according to a second preferred embodiment of the present invention.

FIG. 6 is a plan view similar to FIG. 2 except that the conductive pattern portions 7a are of rectangular configuration in place of those of circular configuration shown in FIGS. 1 and 2. The cross section taken along the line A—A of FIG. 6 corresponds to FIG. 1.

In FIG. 6, like reference numerals and characters designate elements identical with those of FIG. 2. The reference character L1 denotes the length of conductive pattern portions 7A not directly shown in FIG. 6 and raised portions 4A in maximum cross section in the X-Y plane.

The conductive pattern portions 7A and solder raised portions 4A are provided in corresponding relation to the outer wall peripheries 5OE of the frame element 5, respectively, with their central position (L1/2) aligned with the substantial midpoint of the outer wall peripheries 5OE. Then, the raised portions 4A are in face to face contact with the bottom of the outer wall side surfaces 5OWS of the frame element 5 (including the adhesive 6). Since the face to face contact provides a greater contact area than the point contact of FIG. 2, the positioning of the frame element 5 of FIG. 6 is stabler than that of FIG. 2. Despite of such an advantage, the second preferred embodiment is disadvantageous in that, as the area of the conductive pattern portions 7A increases, the raised portions 4A are more difficult to dispose in a small vacant space than the round raised portions 4a of FIG. 2.

The second preferred embodiment also offers the advantages in ease of positioning and bonding the frame element 5 because the conductive pattern portions 7A and raised portions 4A are formed along the outer wall peripheries 5OE.

Figure 7:
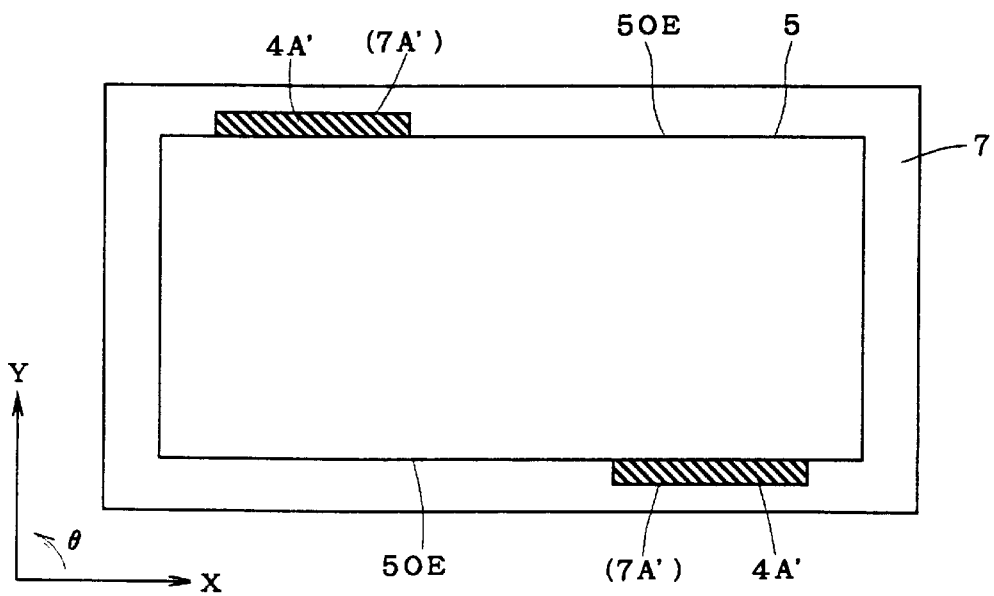
FIG. 7 is a plan view of a variation of the hybrid integrated circuit device of the second preferred embodiment.

Further, the four conductive pattern portion and raised portion pairs of FIG. 6 should not necessarily be required, but at least two conductive pattern portion 7A' and raised portion 4A' pairs may be formed in suitable vacant space as shown in plan view of FIG. 7, thereby achieving the primary object.

(Third Preferred Embodiment)

Figure 8:
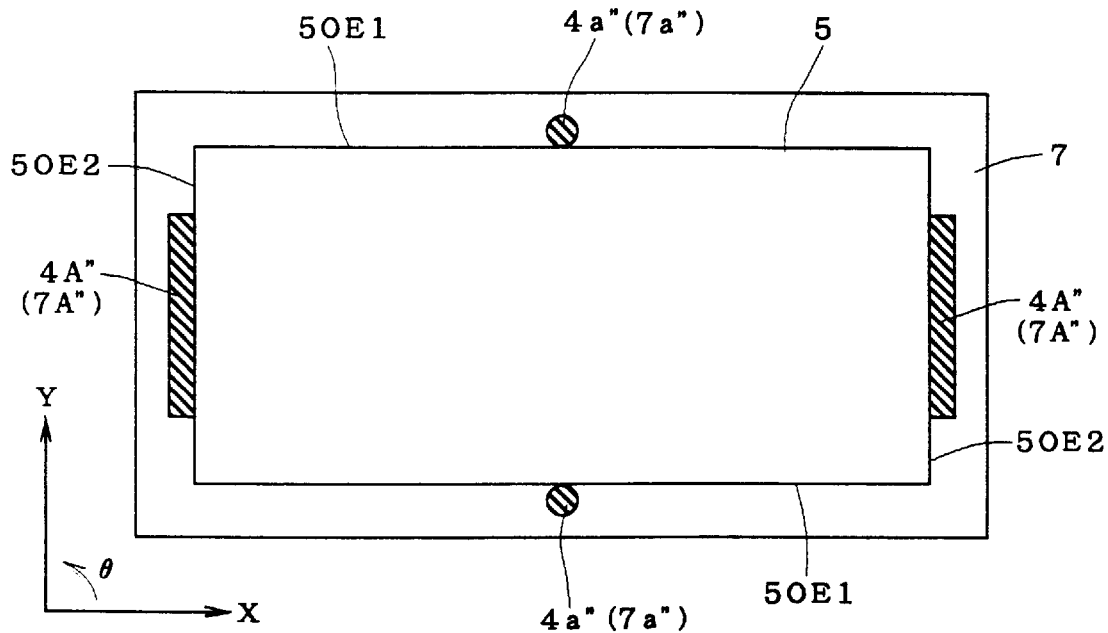
FIG. 8 is a plan view of the hybrid integrated circuit device according to a third preferred embodiment of the present invention.

Referring to FIG. 8 in plan view, the first and second preferred embodiments may be combined together to form the conductive pattern portions and raised portions. Specifically, conductive pattern portions 7a" and raised portions 4a" of circular cross-sectional configuration are formed along outer wall peripheries 5OE1 having a relatively insufficient vacant space on the component mounting surface 7S to effectively use the vacant space for size reduction whereas conductive pattern portions 7A" and raised portions 4A" of rectangular cross-sectional configuration are formed along outer wall peripheries 5OE2 having a relatively sufficient vacant space on the component mounting surface 7S to improve the stable positioning of the frame element 5. This arrangement overcomes the drawbacks of the first and second preferred embodiments while possibly effectively maximizing the advantages thereof.

The cross-sectional configuration of the conductive pattern portions and raised portions is not limited to circles and rectangles, but the conductive pattern portions and raised portions may be of other various configurations.

(Fourth Preferred Embodiment)

Figure 9:
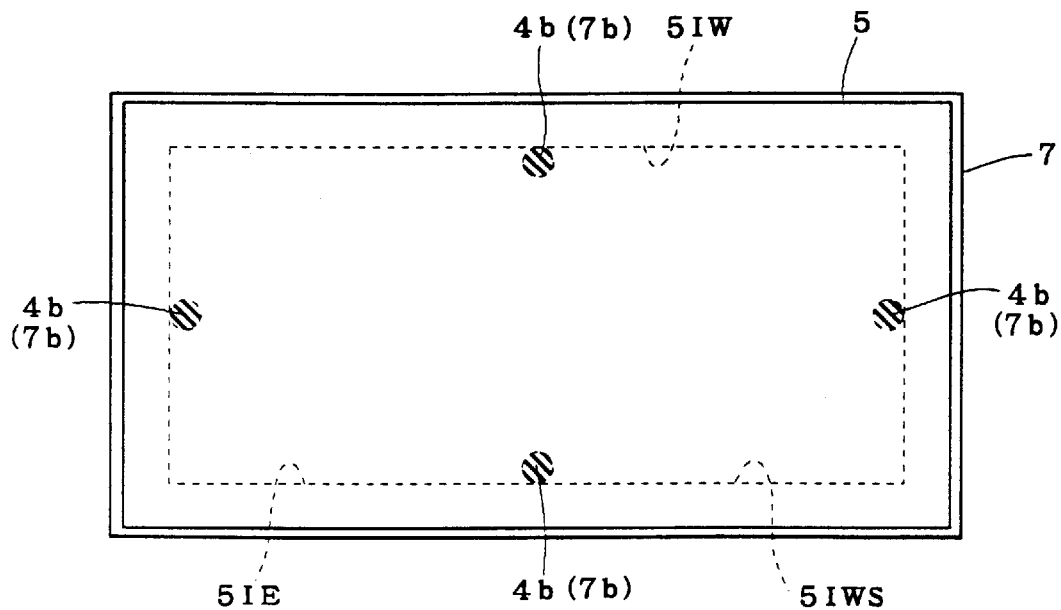
FIG. 9 is a plan view of the hybrid integrated circuit device according to a fourth preferred embodiment of the present invention.

FIG. 9 is a plan view showing conductive pattern portions 7b and solder raised portions 4b both of which are of circular cross-sectional configuration and positioned along or in contact with inner wall peripheries 5IE of the bottom surface 5B of the frame element 5. Such an arrangement may further reduce the size of the device because of the absence of the raised portions on the outer periphery of the frame element 5. This preferred embodiment also has the advantages resulting from the fact that the conductive pattern portions and raised portions are of circular configuration and are positioned at substantially the midpoint of the respective peripheries.

(Fifth Preferred Embodiment)

Figure 10:
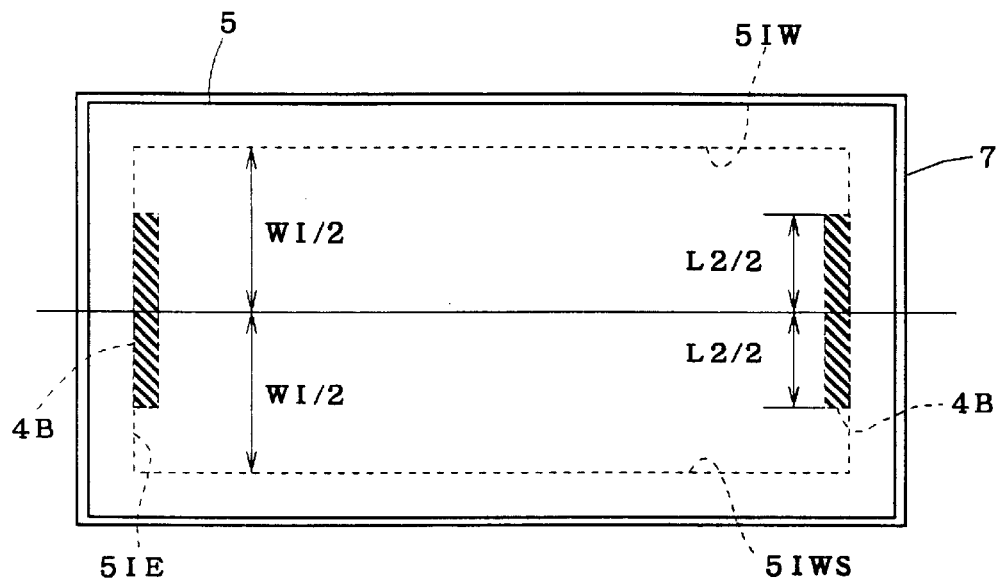
FIG. 10 is a plan view of the hybrid integrated circuit device according to a fifth preferred embodiment of the present invention.

FIG. 10 is a plan view of a variation of FIG. 9 and illustrates at least two conductive pattern portion and raised portion 4B pairs of rectangular cross-sectional configuration formed along or in contact with the inner wall peripheries 5IE. In FIG. 10, the reference character WI denotes the distance between the opposed inner wall side surfaces 5IWS of the frame element 5; 51W denotes inner walls of the frame element 5; and L2 denotes the length of the conductive pattern portions and raised portions 4B in cross section.

This arrangement achieves size reduction of the device in the same manner as in the fourth preferred embodiment and stabler positioning of the frame element 5 in comparison with the fourth preferred embodiment.

(Sixth Preferred Embodiment)

One of the developed applications of the principle of "locally providing the conductive pattern portions and the raised portions along the inner wall peripheries of the frame element" may be considered to include the formation of the conductive pattern portions and raised portions of rectangular cross-sectional configuration or of other configurations having the same functions so as to fill the space between the position of at least one of the plurality of components within the frame element which is mounted adjacent the inner wall side surface of the frame element and the opposed inner wall side surface.

Figure 11:
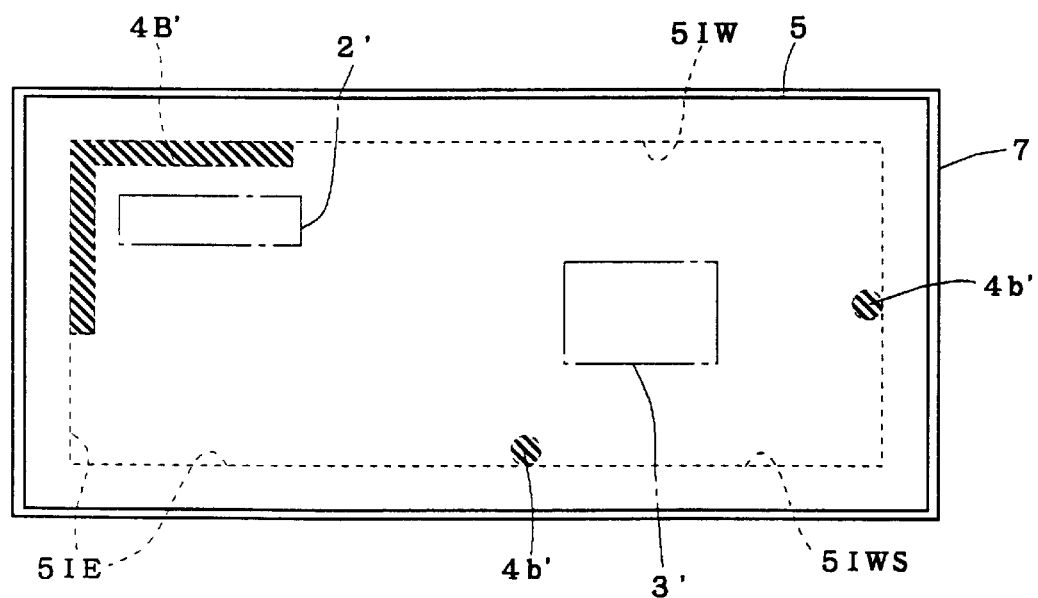
FIG. 11 is a plan view of the hybrid integrated circuit device according to a sixth preferred embodiment of the present invention.

FIG. 11 is a schematic plan view of such an application wherein a component 2' is mounted adjacent the inner wall side surfaces 5IWS. A conductive pattern portion is formed along the inner wall peripheries 51E opposed thereto and an overlying solder raised portion 4B' is formed along or in contact with the inner wall side surfaces 5IWS in such a manner as to fill the space between the component 2' and the inner wall peripheries 5IE opposed thereto. The conductive pattern portion and the raised portion 4B' are of L-shaped cross-sectional configuration in this arrangement. The one L-shaped conductive pattern portion and raised portion pair may be replaced with one or two conductive pattern portion and raised portion pairs of rectangular cross-sectional configuration. In this preferred embodiment, conductive pattern portions and raised portions 4b' of circular cross-sectional configuration are provided in other vacant space.

Such an arrangement is advantageous in that the original object to prevent the positional error of the frame element is achieved while the raised portion 4B' prevents the adhesive applied to the bottom surface of the frame element 5 from flowing in the frame element 5 to adhere to the component adjacent the inner wall side surfaces 5IWS during the bonding and hardening of the adhesive on the frame element 5. This effectively suppresses all external factors which might affect the characteristics of the components within the frame element 5, contributing to further improvements in performance of products.

(Appendix)

The technical principle described in the above stated preferred embodiments may be applied to a hybrid integrated circuit device comprising a printed board as a mounting substrate.

The technical principle is not restricted to the application to the hybrid integrated circuit device but may be applied to any circuit device which includes a plurality of components mounted on a mounting surface of a mounting substrate.

(Fabrication Method)

Description will be given hereinafter on the fabrication flow for the above described hybrid integrated circuit device.

Figure 12:
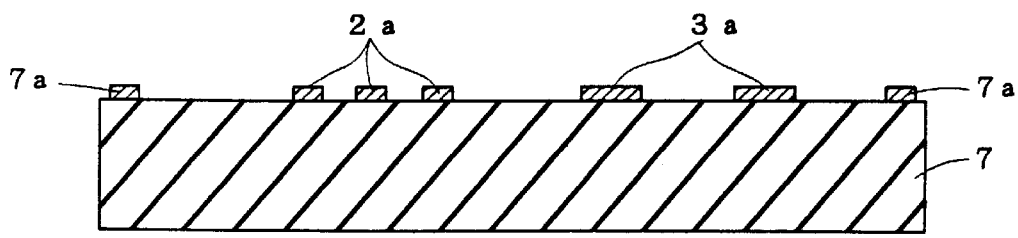
FIGS. 12 through 16 are cross-sectional views showing the fabrication process of the hybrid integrated circuit device according to the present invention.

(1) FIG. 12 is a cross-sectional view of the thick film substrate 7 ($Al_2O_3$ substrate). The thick film electrodes (AgPd) 7a for positioning the frame element, flip chip IC mounting electrodes (AgPd), and multilayer capacitor mounting electrodes (AgPd) are formed on the upper surface of the thick film substrate 7.

Figure 13:
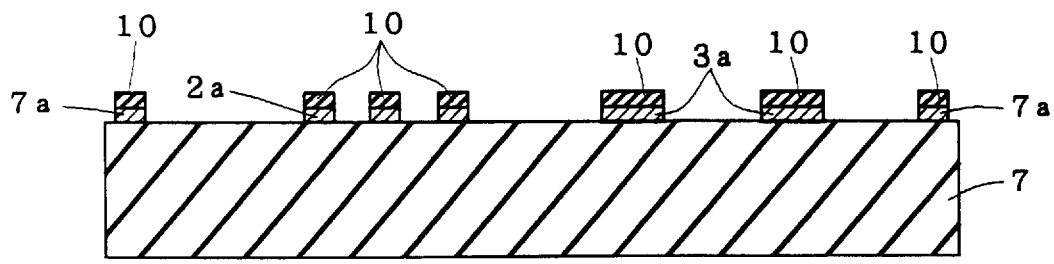

(2) Solder paste 10 is applied in a thickness of about 100 $\mu$m onto the respective patterns of the component mounting electrodes and frame element positioning thick film electrodes 7a on the thick film substrate 7 by the photolithographic process (FIG. 13).

Figure 14:
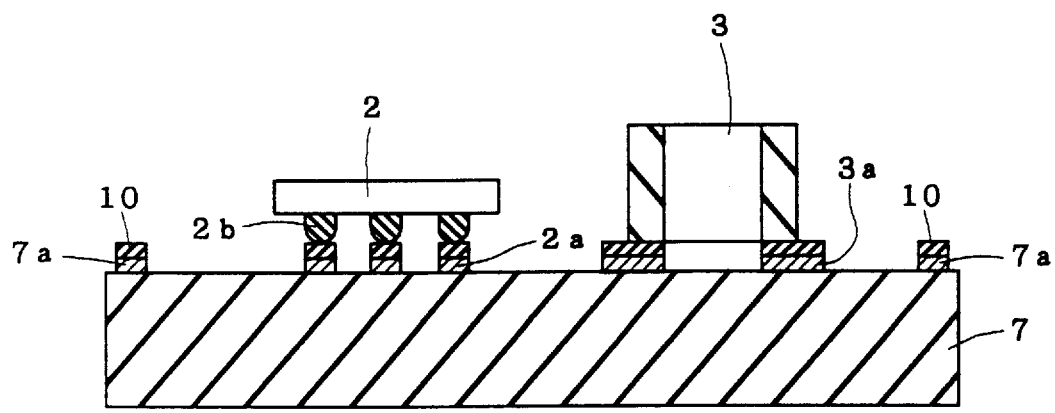

(3) The flip chip IC 2 (a bipolar IC with solder bumps 2b on external electrodes of the bipolar IC) and the multilayer capacitor chip 3 which serve as mounted components are mounted, positioned, and temporarily fixed on the corresponding solder paste 10 (FIG. 14).

Figure 15:
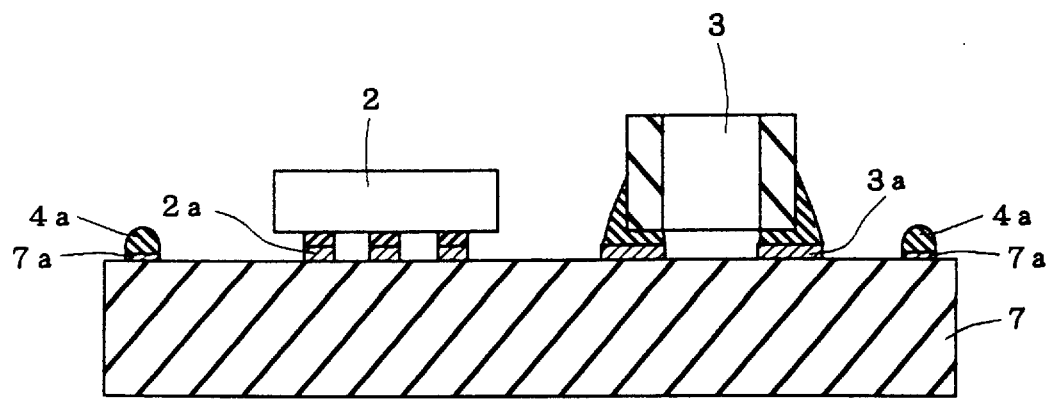

(4) After the temporary fixing of the components is completed, the thick film substrate 7 is fed into a reflow furnace and heated at a temperature (about 230° C.) above the melting point of the solder paste to complete soldering between the thick film electrodes 7a and the electrodes 2a and 3a for the flip chip IC and the like. This forms the solder raised portions 4a on the upper surface of the thick film electrodes 7a (FIG. 15).

Figure 16:
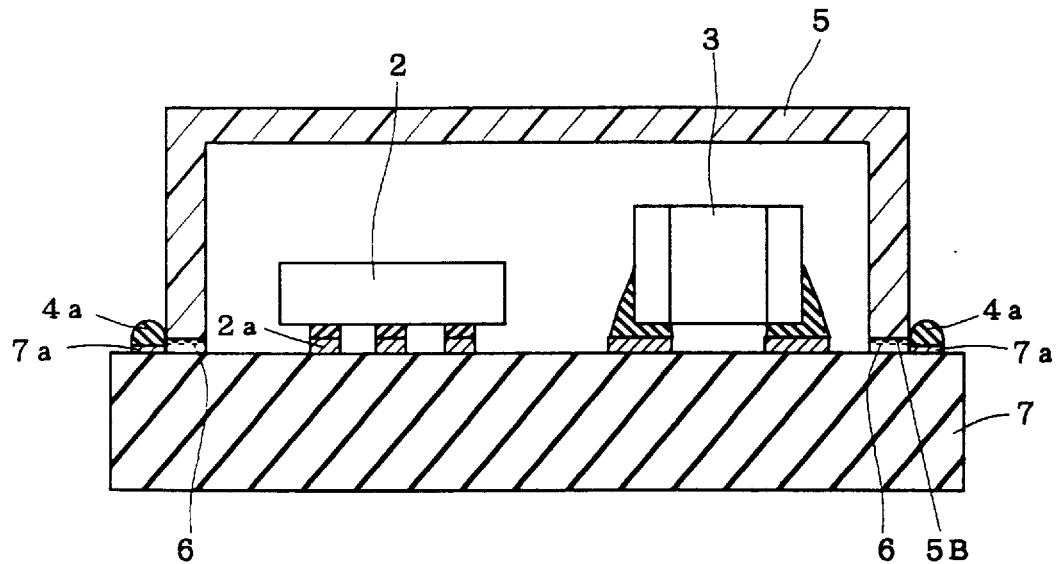

(5) The silicon-based adhesive 6 is applied to the bonding portion, or the bottom surface 5B, of the frame element 5. The adhesive-applied frame element 5 is mounted on the component mounting surface 7S of the thick film substrate 7 subjected to the process step (4) in positional alignment with the raised portions 4a for positioning the frame element. The adhesive 6 is hardened in a constant temperature bath at about 150° C. This completes the fixing of the frame element 5 on the thick film substrate 7. (FIG. 16).

In this fashion, according to the method of the present invention, the raised portions 4a for positioning the frame element may be formed during the process step of mounting the plurality of components.

The hybrid integrated circuit device fabricated by the above described fabrication flow is widely used, for example, as vehicle mounted devices and in other industrial fields.

The fabrication process described with reference to FIGS. 12 through 16 is associated with the first preferred embodiment but is not fundamentally different from those associated with the second to sixth preferred embodiments and the application wherein the printed board is used as the mounting substrate.

While the invention has been described in detail, the foregoing description is in all aspects illustrative and not restrictive. It is understood that numerous other modifications and variations can be devised without departing from the scope of the invention.

I claim:

1. A circuit device comprising:

a mounting substrate;

a plurality of exposed components formed on a component mounting surface of said substrate;

a frame element bonded on a first portion of said component mounting substrate wherein said frame element seals all of said plurality of components within a sealed space, wherein each of said plurality of exposed components are directly exposed to said sealed space;

at least two conductive pattern portion means for positioning said frame element thereby preventing movement of the frame element and preventing said frame element from contacting said plurality of components, wherein said at least two conductive pattern portion means is formed on a second portion of said component mounting surface; and raised portions consisting essentially of solder and formed on said conductive pattern portion means, respectively.

2. The circuit device in accordance with claim 1, wherein said conductive pattern portions are positioned along corresponding outer wall peripheries of a bottom surface of said frame element bonded on said component mounting surface.

3. The circuit device in accordance with claim 1, wherein at least one of said conductive pattern portions is of circular configuration.

4. The circuit device in accordance with claim 1, wherein at least one of said conductive pattern portions is of rectangular configuration.

5. The circuit device in accordance with claim 1, wherein said conductive pattern portions comprise a conductive pattern portion of circular configuration and a conductive pattern portion of rectangular configuration.

6. The circuit device in accordance with claim 1, wherein said conductive pattern portions are locally provided at substantially the midpoint of corresponding outer wall peripheries of a bottom surface of said frame element, respectively.

7. The circuit device in accordance with claim 1, wherein said conductive pattern portions are positioned along corresponding inner wall peripheries of a bottom surface of said frame element bonded on said component mounting surface.

8. The circuit device in accordance with claim 7, wherein said conductive pattern portions comprise a conductive pattern portion positioned along at least one of said inner wall peripheries and between at least one of said plurality of components which is mounted adjacent an inner wall side surface of said frame element and said inner wall side surface.

9. A circuit device comprising:

a mounting substrate;

a plurality of exposed components formed on a component mounting surface of said substrate;

a frame element bonded on a first portion of said component mounting surface wherein said frame element seals all of said plurality of components within a sealed space, wherein each of said plurality of exposed components are directly exposed to said sealed space;

a plurality of raised portion means for positioning said frame element to prevent movement of said frame element and prevent said frame element from contacting said plurality of components, wherein said plurality of raised portion means are provided on a second portion of said component mounting surface.

10. A circuit device comprising:

a mounting substrate;

plurality of exposed components formed on a component mounting surface of said substrate;

a frame element bonded on a first portion of said component mounting surface wherein said frame element seals all of said plurality of components within a sealed space, wherein each of said plurality of exposed components are directly exposed to said sealed space;

at least two conductive pattern portions formed on a second portion of said component mounting surface for positioning said frame element thereby preventing movement of said frame element and preventing said frame element from contacting said plurality of components; and raised portions consisting essentially of solder and formed on said conductive pattern portions, respectively, said raised portions being not bonded on said frame element.

11. A circuit device comprising:

a mounting substrate;

a plurality of exposed components formed on a component mounting surface of said substrate;

a frame element bonded on a first portion of said component mounting surface wherein said frame element seals all of said plurality of components within a sealed space, wherein each of said plurality of exposed components are directly exposed to said sealed space;

a plurality of raised portions provided on a second portion of said component mounting surface and not bonded on said frame element, said plurality of raised portions configured for positioning said frame element to prevent movement of said frame element and prevent said frame element from contacting said plurality of components.

* * * * *